US 8,145,846 B2

(12) United States Patent
Hong et al.

(10) Patent No.: US 8,145,846 B2
(45) Date of Patent: Mar. 27, 2012

(54) MEMORY SYSTEM HAVING NONVOLATILE AND BUFFER MEMORIES, AND READING METHOD THEREOF

(75) Inventors: Sung-Pack Hong, Gyeonggi-do (KR); Hye-Jeong Nam, Gyeonggi-do (KR); Se-Wook Na, Gyeonggi-do (KR); Shea-Yun Lee, Seoul (KR); Tae-Beom Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/194,041

(22) Filed: Jul. 29, 2011

(65) Prior Publication Data

US 2011/0289264 A1 Nov. 24, 2011

Related U.S. Application Data

(62) Division of application No. 12/168,778, filed on Jul. 7, 2008, now Pat. No. 8,015,360.

(30) Foreign Application Priority Data

Jul. 6, 2007 (KR) .................. 10-2007-0068149

(51) Int. Cl.
*G06F 13/38* (2006.01)

(52) U.S. Cl. ........ 711/137; 711/103; 711/165; 711/168; 711/171

(58) Field of Classification Search .................. 711/103, 711/137, 165, 168, 171
See application file for complete search history.

(56) References Cited

U.S. PATENT DOCUMENTS

| 6,549,982 | B1 | 4/2003 | Yamanaka |
| 7,467,377 | B2 * | 12/2008 | Wu et al. ........................ 717/154 |
| 2003/0204675 | A1 | 10/2003 | Dover et al. |
| 2004/0255083 | A1 | 12/2004 | Chilimbi |
| 2009/0063818 | A1 * | 3/2009 | Gschwind et al. ............ 712/204 |

FOREIGN PATENT DOCUMENTS

| CN | 1538284 | 10/2004 |
| JP | 2004-102781 | 4/2004 |
| JP | 2004-164193 | 6/2004 |
| JP | 2005-38454 | 2/2005 |
| JP | 2006-114206 | 4/2006 |
| KR | 10-2004-0086929 | 10/2004 |

* cited by examiner

*Primary Examiner* — Jae Yu
(74) *Attorney, Agent, or Firm* — Myers Bigel Sibley & Sajovec, P.A.

(57) ABSTRACT

Disclosed is a method for reading data in a memory system including a buffer memory and a nonvolatile memory, the method being comprised of: determining whether an input address in a read request is allocated to the buffer memory; determining whether a size of requested data is larger than a reference unless the input address is allocated to the buffer memory; and conducting a prefetch reading operation from the nonvolatile memory if the requested data size is larger than the reference.

8 Claims, 6 Drawing Sheets ific RAM). For example, data from a host are first stored in the buffer memory before being transferred to the flash memory. The data stored in the buffer memory is then written into the flash memory. Also, data read out from the flash memory are first stored in the buffer memory before being transferred to the host. Thereafter, the data are read from the buffer memory and transferred to the host.

MEMORY SYSTEM HAVING NONVOLATILE AND BUFFER MEMORIES, AND READING METHOD THEREOF

CLAIM OF PRIORITY

The present application is a divisional of and claims priority from U.S. patent application Ser. No. 12/168,778, filed Jul. 7, 2008 now U.S. Pat. No. 8,015,360, which claims priority under 35 U.S.C. §119 to Korean Patent Application No. 10-2007-0068149, filed Jul. 6, 2007, the disclosures of which are hereby incorporated by reference herein in their entireties.

BACKGROUND

Embodiments of the present invention disclosed herein relate generally to memory systems and particularly to memory systems including nonvolatile memory and reading methods thereof.

Nonvolatile memories retain data even when no power is supplied to the memory. Nonvolatile memories are typically mask read-only memories, or electrically erasable and programmable read-only memories (EEPROMs).

Flash memories, which are another type of nonvolatile memory, originated with the publication of the term 'flash EEPROM' by Toshiba. Flash memories were developed from traditional EEPROMs but with modifications in architecture and operation. Flash memory can be erased by block, sector, or the entire chip. Further, flash memory is able to conduct a bit-level programming operation. Flash memory is similar to a disk-type subsidiary memory device, which has a structure that is formatted in sectors.

Flash memories are available in two different architectures: NOR types where memory cells are arranged in parallel between a bit line and a ground line; and NAND types where memory cells are arranged in series between a bit line and a ground line. NOR flash memories have simple peripheral circuits and short read-access time, but require more cell area than NAND types because they require contact electrodes for each bit line respective to memory cells. With NAND flash memories, however, it is necessary to select a corresponding block prior to reading data, and NAND flash memories operate with large resistance due to a serial connection of memory cells. Therefore, a read operation in a NAND flash memory is relatively slower than in a NOR type.

Flash memories are nonvolatile memory devices suitable for high integration density. Because of their superior data retention, flash memories are used as main memory in some systems. Flash memories are noteworthy for high-density large-capacity data storage, and can replace conventional hard disks or floppy disks. Currently, flash memories are widely employed as storage media in portable digital apparatus such as mobile phones, digital cameras, MP3 players, camcorders, personal data assistants, or so forth.

However, flash memories have lower data input/output rates than random access memories (RAMs). Delay times in flash memories are encountered while writing data, which are temporarily stored in page buffers before being written into a cell array, and while reading out data, which are first transferred from the cell array into the page buffers.

To enable flash memories to operate in a random access manner, new schemes have been developed for supporting a random access function by means of a buffer memory in a flash memory system. The buffer memory is used to temporarily store data therein before writing the data into the flash memory or transferring the data to a host. The buffer memory is usually a type of random accessible memory (e.g., dynamic or static RAM). For example, data from a host are first stored in the buffer memory before being transferred to the flash memory. The data stored in the buffer memory is then written into the flash memory. Also, data read out from the flash memory are first stored in the buffer memory before being transferred to the host. Thereafter, the data are read from the buffer memory and transferred to the host.

SUMMARY OF THE INVENTION

An aspect of the present invention is method for reading data in a memory system including a buffer memory and a nonvolatile memory, comprising: determining whether an input address in a read request is allocated to the buffer memory; and if the input address is not allocated to the buffer memory: determining whether a size of requested data is larger than a reference, and conducting a prefetch reading operation from the nonvolatile memory if the requested data size is larger than the reference.

In an embodiment, the input address is a start address. Read request information including the start address and the requested data size is provided to read data beginning from the start address in an amount determined by the requested data size in response to the read request.

In an embodiment, the prefetch operation includes reading data beginning from the start address in an amount greater than the requested data size from the nonvolatile memory. The data read during the prefetch reading operation is temporarily stored in the buffer memory.

In an embodiment, the method further comprises: allocating the buffer memory to store the data read from the nonvolatile memory during the prefetch reading operation if the requested data size is larger than the reference.

In an embodiment, the method further comprises: transferring the data stored in the buffer memory during the prefetch reading operation to an external system from the buffer memory.

In an embodiment, the method further comprises: searching an address mapping table of the buffer memory for the start address and addresses corresponding to the requested data to determine whether the input address is allocated to the buffer memory.

In an embodiment, the method further comprises: transferring the requested data to an external system from the buffer memory if the input address is allocated to the buffer memory.

In an embodiment, the method further comprises: conducting a normal reading operation on the nonvolatile memory unless the requested data size is larger than the reference.

In an embodiment, during the normal reading operation, data read from the nonvolatile memory is transferred to an external system without passing through the buffer memory.

Another aspect of the present invention is a method for reading data in a memory system including a buffer memory, a flash memory, and a disk, comprising: determining whether an input address in a read request is allocated to the buffer memory; determining whether the input address is allocated to the flash memory if the input address is not allocated to the buffer memory; determining whether a size of requested data is larger than a reference if the input address is not allocated to the flash memory; and conducting a prefetch reading operation from the flash memory if the requested data size is larger than the reference.

Still another aspect of the present invention is a method for reading data in a memory system including a buffer memory, a flash memory, and a disk, comprising: simultaneously determining whether an input address in a read request is allocated to the buffer memory, the flash memory, or the disk; determining whether a size of requested data is larger than a reference if the input address is allocated to the flash memory; and conducting a reading operation from the flash memory if the requested data size is larger than the reference.

Yet another aspect of the present invention is a memory system comprising: a flash memory; a disk; a buffer memory to temporarily store data read from the flash memory or the disk during a prefetch reading operation; and a controller operable to control the flash memory, the disk, and the buffer memory and to determine whether to conduct the prefetch reading operation or a normal reading operation from the flash memory in accordance with a size of data requested by a read request.

In an embodiment, the controller conducts the reading operation from the disk in response to the read request.

In an embodiment, during the normal reading operation from the flash memory, data read from the flash memory is transferred directly to an external system without passing through the buffer memory.

In an embodiment, the controller simultaneously determines whether an address input by the read request is allocated to the buffer memory, the flash memory, or the disk.

In an embodiment, the controller first determines whether an address input by the read request is allocated to the buffer memory.

In an embodiment, the controller transfers the requested data to an external system from the buffer memory if the input address is allocated to the buffer memory.

In an embodiment, the controller determines whether the input address is allocated to the flash memory unless the input address is allocated to the buffer memory.

In an embodiment, the controller determines whether to conduct the prefetch reading operation or the normal reading operation in accordance with the requested data size if the input address is allocated to the flash memory.

In an embodiment, the controller conducts the prefetch reading operation from the disk unless the input address is allocated to the flash memory.

A further understanding of the nature and advantages of the present invention herein may be realized by reference to the remaining portions of the specification and the attached figures.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
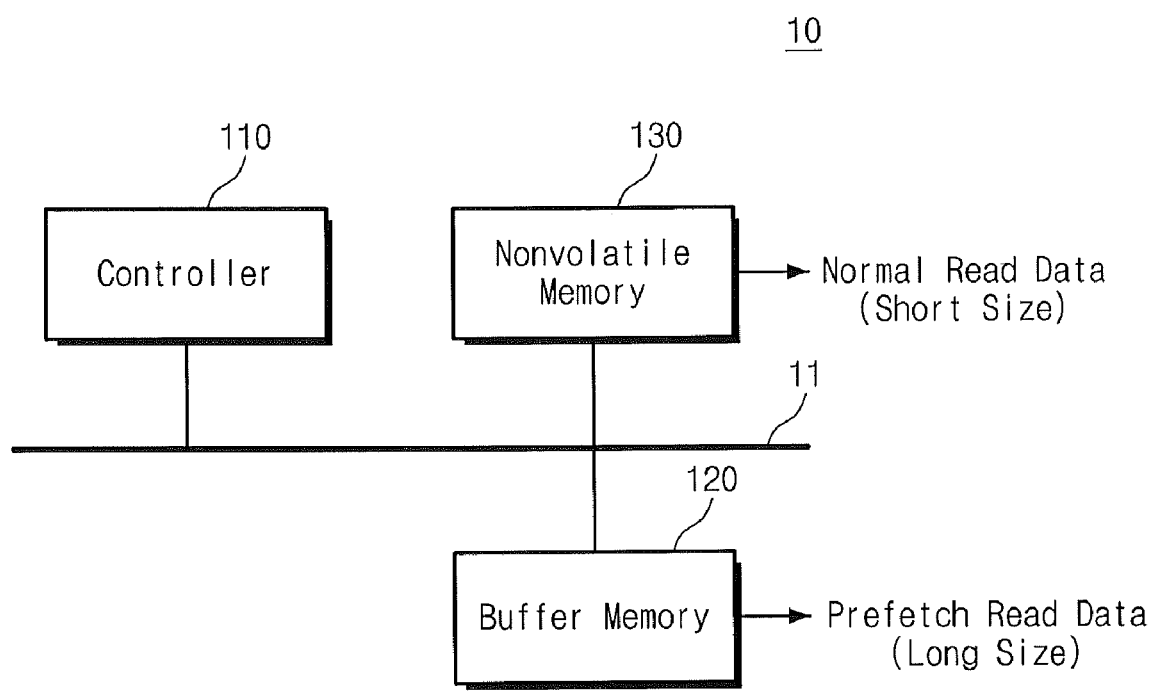
FIG. 1 is a block diagram of a memory system according to an embodiment of the present invention.

Preferred embodiments of the present invention will be described below, involving a nonvolatile memory device as an example in illustrating structural and operational features. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

A memory system according to an embodiment of the present invention operates by determining whether to execute a prefetch reading operation based on the requested data size provided with a read request. Prefetch refers to transferring data to a buffer memory before the reading operation. For instance, when data requested in the reading operation of a nonvolatile memory is larger than a reference size, the memory system fetches the requested data, along with additional data to be requested later, and then stores those data into the buffer memory. The memory system of the present invention thereby enhances practical use of the buffer memory for the read request by which addresses are sequentially introduced therein. As a result, it effects an improvement in the data reading rate in the memory system.

An exemplary embodiment of the present invention will be described in conjunction with the accompanying drawings.

FIG. 1 is a block diagram of a memory system 10 according to an embodiment of the present invention. Referring to FIG. 1, the memory system 10 includes a controller 110, a buffer memory 120, and a nonvolatile memory 130, communicating through a bus or channel 11. When there is a request to read data from the nonvolatile memory 130, a prefetch reading operation is conducted with a data prefetch, or a normal reading operation is conducted without data prefetch, depending on the size of data requested. For instance, if the size of data requested is larger than a reference, the prefetch reading is carried out. But if the size of data requested for reading is smaller than the reference, the normal reading operation is carried out.

Data taken by the prefetch reading operation from the nonvolatile memory 130 are temporarily stored in the buffer memory 120. Then, among the data held in the buffer memory, only the data requested for reading are transferred to an external system.

The controller 110 functions to control the general operations of the memory system 10. The controller receives commands, addresses, and data from an external system (e.g., host) and controls the reading and writing operations. The controller accepts a read request as follows. As an example, if a read request R<100,60> is input to the controller 110, this instructs the controller to read 60 sectors of data beginning from the start address '100'.

The controller 110 determines whether addresses corresponding with data requested for reading are allocated to the buffer memory 120. Here, the addresses corresponding to the requested data are those for 60 sectors of data beginning from the start address '100'. If addresses corresponding to the requested data are allocated to the buffer memory 120, the requested data are read from the buffer memory 120 and then transferred to the external system. If addresses corresponding to the requested data are not allocated to the buffer memory 120, the controller 110 conducts the reading operation from the nonvolatile memory 130. The reading operation from the nonvolatile memory 130 is differentiated into prefetch and normal modes in accordance with the size of the requested data.

The prefetch mode operates to read out (i.e., to fetch) data, which is larger than the requested data by a predetermined size, from the nonvolatile memory 130. Data read out in prefetch mode are stored in the buffer memory 120. For instance, the additional data to be read out may be equal to the requested data in size (60 sectors), so a total of 120 sectors must be read. If the requested data size is 100 sectors, the controller 110 reads 200 sectors of data from the nonvolatile memory 130 during the prefetch mode and stores them into the buffer memory 130. In prefetch mode, the controller 110 converts requested addresses into prefetch addresses corresponding to data to be prefetched.

Meanwhile, the normal mode operates to read out data, which is smaller than the requested data by a predetermined size, from the nonvolatile memory 130. Data read in the normal mode is transferred directly to an external system without passing through the buffer memory 120. This normal reading mode in which data is not transferred through the buffer memory prevents an increase in the pollution level of the buffer memory 120. Less pollution in the buffer memory 120 means more space for storing data read in prefetch mode. In other words, it enhances the usability of the buffer memory 120.

The controller 110 determines whether to conduct a prefetch mode reading operation from the nonvolatile memory 130 by comparing the reference with the size of data transferred thereto in response to a read request. The reference may be experientially derived in correspondence with environments of the memory system.

During the writing operation, the buffer memory 120 temporarily stores data stored in the nonvolatile memory 130, and an address and command are transferred from an external system. In addition, during the reading operation, the buffer memory 120 temporarily stores data, which is sensed from the nonvolatile memory 130, before the data is transferred to an external system. In general, the buffer memory 120 may be implemented in a static or dynamic RAM, but is not restricted thereto.

The nonvolatile memory 130 is provided as a reservoir for storing data. The nonvolatile memory 130 may be implemented, e.g., as a flash memory, a mask ROM, a programmable ROM, or a ferroelectric RAM. If the size of data requested by an external system is larger than the reference, data read from the nonvolatile memory 130 is first stored in the buffer memory 120 and then transferred to the external system. To the contrary, unless the size of data requested by the external system is larger than the reference, data read from the nonvolatile memory 130 is transferred directly to the external system without passing through the buffer memory 120.

The nonvolatile memory 130 may be configured to conduct all the prefetch and normal reading modes. For instance, according to the size of data requested by an external system, the controller 110 generates and provides a prefetch or normal read command to the nonvolatile memory 130. The nonvolatile memory 130 may be configured to read data corresponding to an input address in response to the prefetch command, and also reads data corresponding to an adjacent address of the input address. The nonvolatile memory 130 may also be configured to read only data corresponding to an input address in response to the normal read command.

In the memory system 10 of an embodiment of the present invention, the reading operation begins by determining whether to conduct a prefetch reading operation or a normal reading operation in accordance with the size of requested data. If the size of requested data is larger than the reference, a prefetch reading operation is carried out through the buffer memory 120. Thus, if data to be read are successively input data, the probability that the next data to be requested will be already be in buffer memory 120 is increased. The memory system 10 is thus able to efficiently use the buffer memory 120 to retrieve data successively requested, thereby shortening the time for reading such data.

Figure 2:
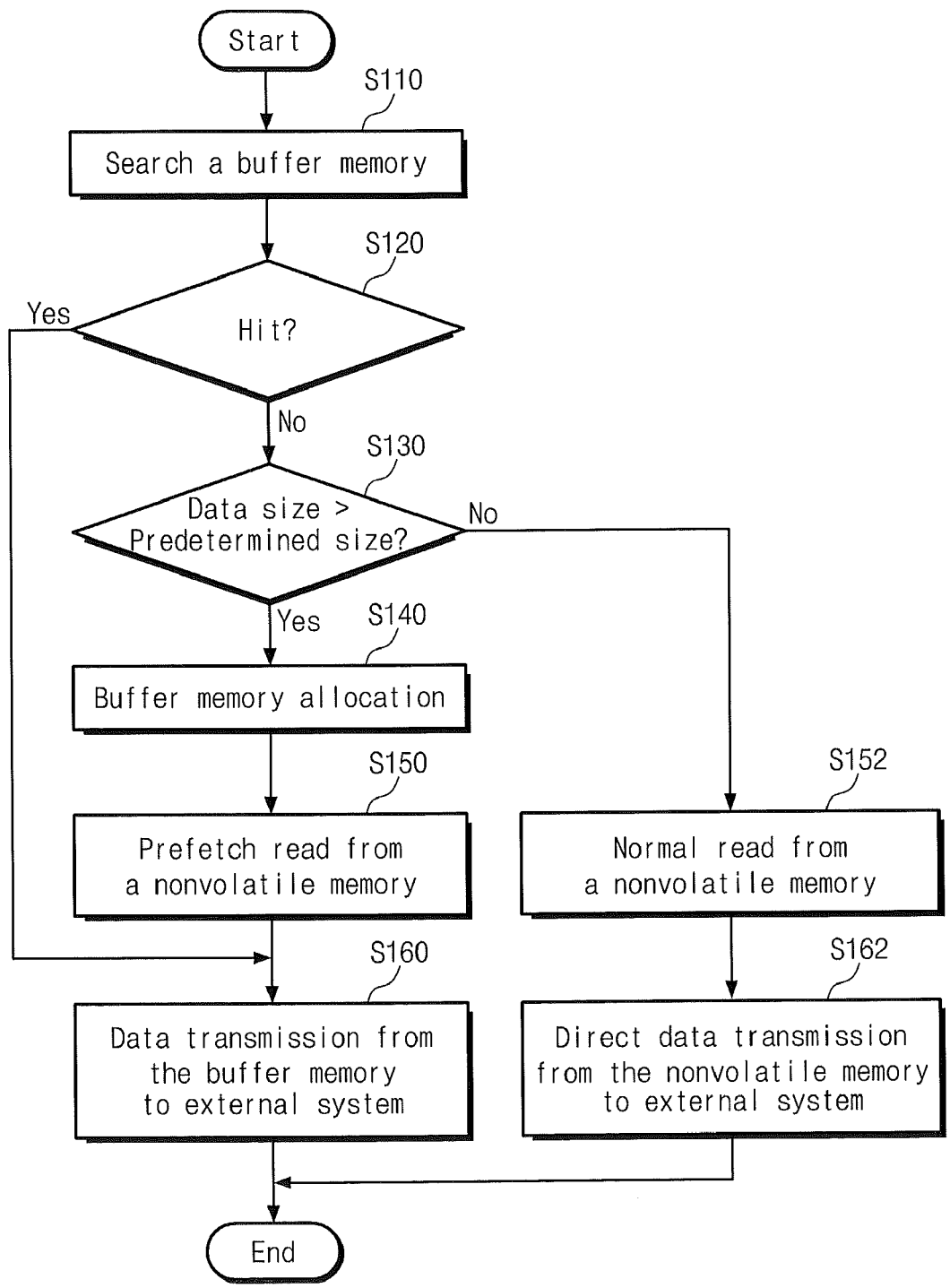
FIG. 2 is a flow chart showing a reading method of the memory system according to an embodiment of the present invention.

FIG. 2 is a flow chart showing a reading method of the memory system 10 according to an embodiment of the present invention. Referring to FIGS. 1 and 2, the reading method in the memory system 10 is as follows.

First, an external host (not shown) requests data from the memory system 10. In detail, the memory system 10 accepts read request information including a start address and the number of requested addresses. Here, the number of requested addresses means the size of requested data. For example, a read request with R<100,30> means to read 30 sectors of data beginning from the start address '100'. Hereinafter, it is assumed that the read operation is carried out based on the read request with R<100,30>. It is also assumed that the prefetch mode operates to read twice the requested data.

The memory system 10 receives the read request of R<100, 30> from an external host. Then, the controller 110 determines whether the start address '100' transferred by the read request is allocated to the buffer memory (S110). Namely, the controller 110 searches an address mapping table of the buffer memory 120 to determine whether the start address '100' and addresses corresponding to 30 sectors of data beginning at the start address, are allocated to the buffer memory 120. From the result of searching for the addresses, the controller 110 determines whether the buffer memory 120 is conditioned in a HIT state (S120). A HIT condition for the buffer memory 120 means that the addresses corresponding to the requested data are found in the address mapping table. If the buffer memory 120 is determined to be in the HIT state, the controller 110 reads the 30 sectors of data, which are arranged from the start address '100', from the buffer memory 120, and transfers the data to the host (S160). The reading operation is thereby completed.

Otherwise, if the buffer memory 120 is not in the HIT state, the controller 110 detects the nonvolatile memory 130 as a location to which the start address is allocated, and determines whether the size of the requested data is larger than the reference (S130). The prefetch or normal reading mode will be enabled in accordance with the size of the requested data.

If the size of the requested data is larger than the reference, the controller 110 allocates the buffer memory 120 with corresponding addresses in order to temporarily store the requested data therein (S140). Afterward, the controller 110 executes the prefetch mode for the nonvolatile memory 130 (S150). Namely, the controller 110 reads the 60 sectors of data, beginning from the start address '100', from the nonvolatile memory 130. The read data from the 60 sectors are stored in the buffer memory 120. After storing the 60-sectors of data that have been read from the nonvolatile memory 130, the address mapping table is undated to include mapping information for addresses corresponding to the 60-sectors of data beginning with the start address '100'. Then, the controller 110 reads 30 sectors of data from the start address '100' stored in the buffer memory 120 and transfers them to the host (S160). The operation for reading data is thereby completed.

If the size of the requested data is not larger than the reference, the controller 110 performs a normal reading operation from the nonvolatile memory 130 (S152). In the normal reading mode, the controller 110 reads 30-sectors of data, which begins from the start address '100', from the nonvolatile memory 130 and transfers the 30-sectors of read data directly to the host (S162). Thereby, it terminates the normal reading mode.

The reading method in the memory system 10 according to an embodiment of the present invention is carried out in the prefetch or normal reading mode from the nonvolatile memory in accordance with the size of the requested data. As a result, it is able to efficiently manage the reading operation.

Figure 3:
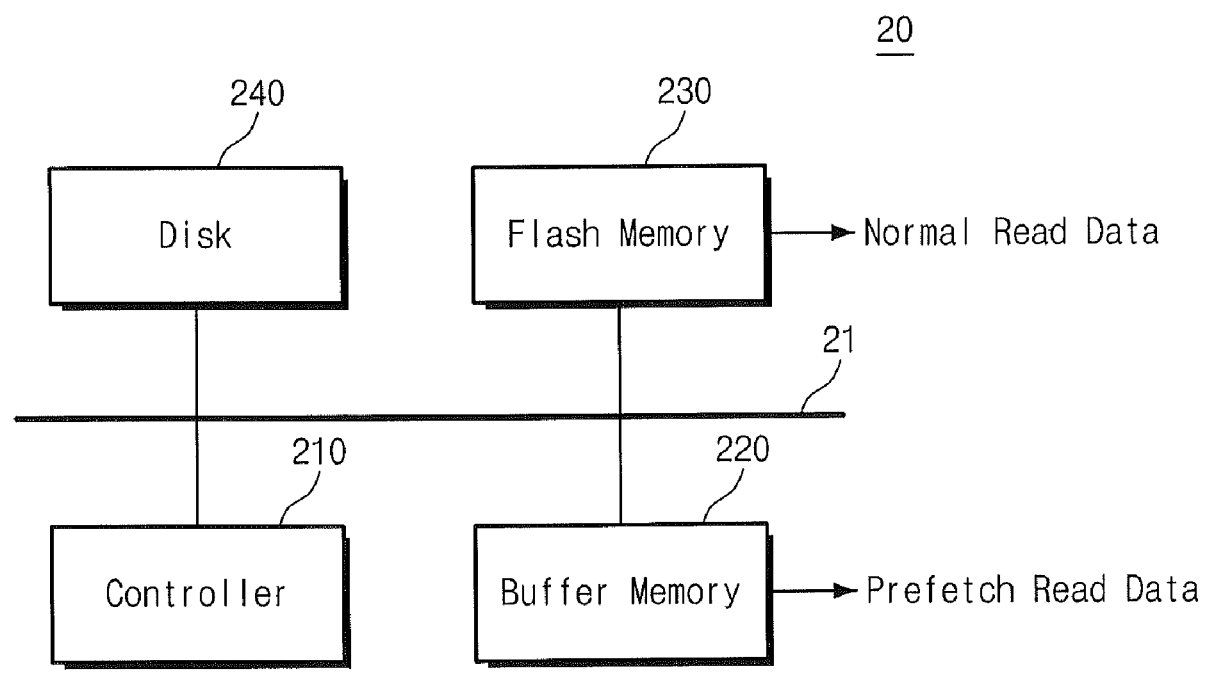
FIG. 3 is a block diagram showing an embodiment of a memory system according to an embodiment of the present invention.

Embodiments of the present invention are also applicable to a memory system 20 including pluralities of storage devices. FIG. 3 is a block diagram showing an embodiment of such a memory system according to an embodiment of the present invention. Referring to FIG. 3, the memory system 20 includes a controller 210, a buffer memory 220, a flash memory 230, and a disk 240 interconnected by a bus or channel 21. The flash memory 230 is generally a storage device operable with a faster initial response, while the disk 240 operates with a slower initial time. When there is a request to read from the disk 240, which is relatively slow in the initial response, a prefetch reading mode is enabled for data prefetch.

In contrast, when there is a request to read from the flash memory 230, which responds thereto quickly, the memory system 20 conducts the reading operation by determining whether to enable the prefetch mode or not in accordance with the size of requested data. For instance, if the size of the requested data is larger than a reference, the memory system 20 operates with the flash memory 230 in the prefetch mode.

The controller 210 according to an embodiment of the present invention searches a table to determine whether an addresses input in the reading operation is allocated to the buffer memory 220. From the result of the search, if the input address is allocated to the buffer memory 220, the controller 210 operates to transfer data, which corresponds to the input address, from the buffer memory 220 to an external system. Otherwise, if the result of the search indicates that there is no allocation of the input address to the buffer memory 220, the controller 210 resumes to find the input address from the flash memory 230.

If the input address is allocated to the flash memory 230, the controller 210 conducts one of either a prefetch and normal reading operation from the flash memory 230 with reference to the size of the requested data.

During the prefetch operation, the controller 210 generates a prefetch address for the prefetch operation in accordance with the input address and applies the prefetch address to the flash memory 230. The flash memory 230 executes the reading operation in response to the prefetch address. The data read at this time is transferred to the buffer memory 220. The controller 210 fetches the requested data from the buffer memory 220 and transfers the data to an external system.

During the normal reading mode, the controller 210 provides the flash memory 230 with a physical address corresponding to the input address. The flash memory 230 executes the reading operation in response to the physical address transferred thereto. Data read at this time is transferred directly to the external system without passing through the buffer memory 220.

From the result of the search, if the input address is not allocated to the flash memory 230, the controller 210 conducts prefetch reading operation from the disk 240. The prefetch mode for the disk 240 is similar to that for the flash memory 230, so will not be further detailed.

The buffer memory 220 and the flash memory 230 are the same as those memories 120 and 130 show in FIG. 1. The disk 240 may be a hard disk drive (HDD). The HDD is a data reservoir configured to store data in an aluminum substrate coated by a magnetic material. The HDD is comprised of a metallic disk platter storing data, a head moving on the platter and recording, correcting, and erasing data, and a spindle motor rotating the platter.

Figure 4:
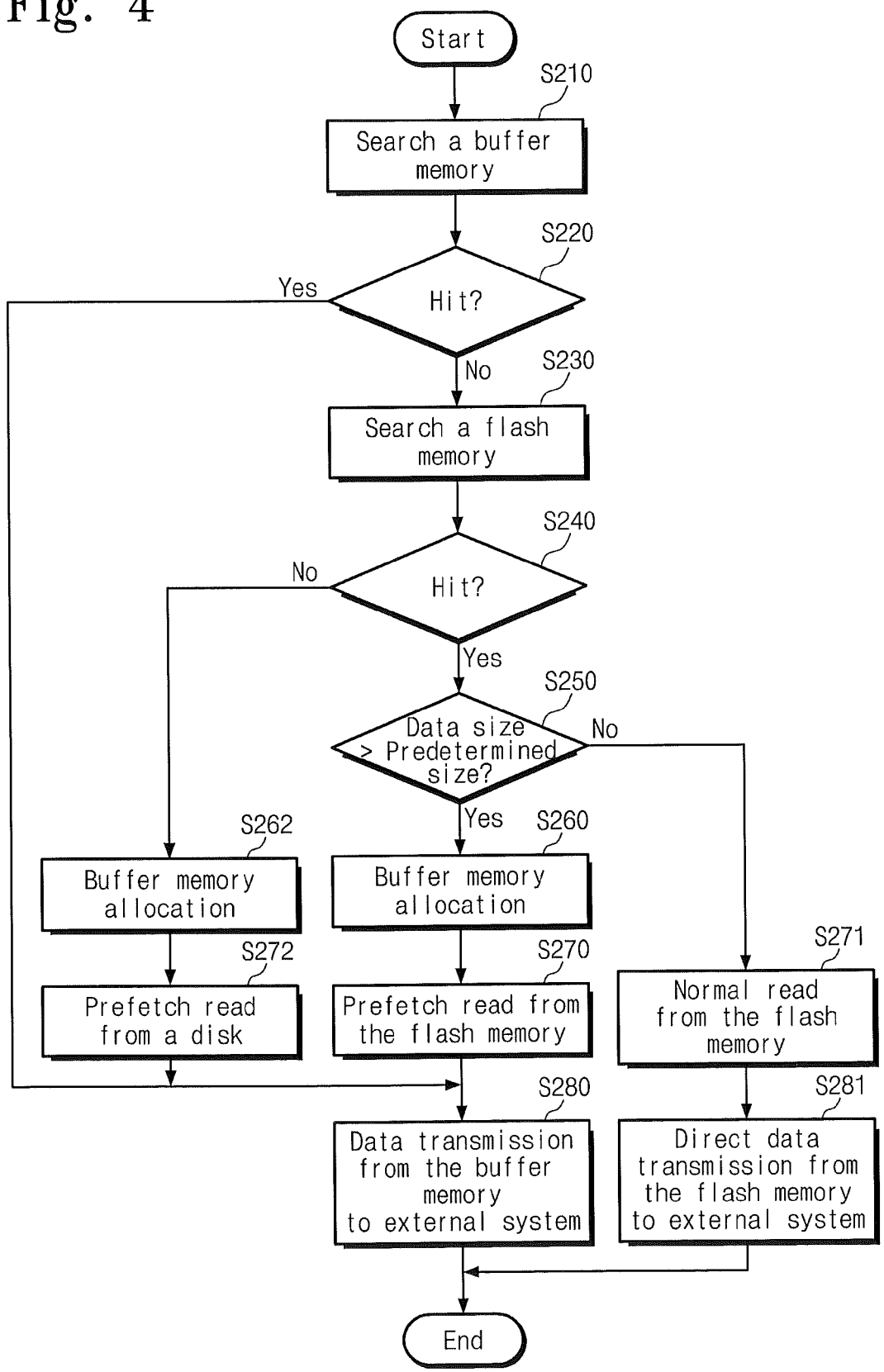
FIG. 4 is a flow chart showing a reading method of the memory system illustrated in FIG. 3 according to an embodiment of the present invention.

FIG. 4 is a flow chart showing a reading method of the memory system 200 illustrated in FIG. 3. Referring to FIGS. 3 and 4, the reading method of the memory system 20 is as follows.

An external host (not shown) requests a reading operation from the memory system 20. In detail, the memory system 20 accepts the read request from the host, including a start address and the number of requested addresses. Hereinafter, for convenience of illustration, the reading operation will be described under the assumption that the read request is exemplarily set by R<100, 30>. Also, the prefetch mode is exemplarily defined as reading two times the amount of data that is requested.

The memory system 20 receives a read request of R<100, 30> from the external host. The controller 210 determines whether the start address '100' transferred by the read request is allocated to the buffer memory 220 (S210). In other words, it determines whether the address mapping table includes the start address '100' and the addresses corresponding 30 sectors from the start address '100'. The controller 210 determines whether the buffer memory 220 is conditioned in a HIT state in accordance with the result of the search (S220). The HIT state of the buffer memory 220 indicates that the addresses corresponding to the requested data are found from the address mapping table of the buffer memory 220. If the buffer memory 220 is conditioned in the HIT state, the controller 210 reads 30 sectors of data corresponding to the start address '100' and transfers the read data to the host (S280). The reading operation is thereby completed.

Otherwise, if the buffer memory 220 is not conditioned in the HIT state, the controller 210 determines whether the start address '100' transferred thereto at the read request is allocated to the flash memory 230 (S230). In other words, it determines whether the address mapping table of the flash memory 230 includes the start address '100'. From the result of the search, the controller 210 checks whether the flash memory 230 is conditioned in the HIT state (S240).

If the flash memory 230 is not conditioned in the HIT state, the controller 210 determines that the start address '100' is allocated to the disk 240 and assigns the buffer memory 220 for storing the data requested by the disk 240 (S262). Then, the controller 210 conducts the prefetch reading operation from the disk 240 (S272). That is, the controller 210 reads 60 sectors of data from the disk 240, beginning from the start address '100'. The read data from the 60 sectors are stored in the buffer memory 220. After storing the data from the disk 240 into the buffer memory 220, the address mapping table of the buffer memory 220 is updated to include mapping information about the start address '100' and the addresses corresponding to the 60 sectors of data. Afterward, the controller 210 reads the 30 sectors of data from the buffer memory 220, beginning from the start address '100', and transfers the 30 sector of data to the host (S280). The prefetch mode is thereby completed.

If the flash memory 230 is conditioned in the HIT sate, the controller 210 determines whether the size of the requested data is larger than the reference or not (S250). Since there is a request for 30 sectors of data, the requested data is sized in correspondence with the 30 sectors. According to the requested data size, a prefetch or normal reading operation is carried out from the flash memory 230.

If the requested data size is larger than the reference, the controller 210 assigns the buffer memory for temporarily storing the data requested from the flash memory 230 (S260). Then, the controller 210 conducts a prefetch reading operation from the flash memory 230 (S270). Namely, the controller 210 reads data from 60 sectors of the flash memory 230, beginning from the start address '100'. The read data from the 60 sectors are stored in the buffer memory 220. After storing the data from the flash memory 230 into the buffer memory 220, the address mapping table of the buffer memory 220 is updated to include mapping information about the start address '100' and the addresses corresponding to the 60 sectors of data. Afterward, the controller 210 reads the 30 sectors of data from the buffer memory 220, beginning from the start address '100', and transfers the 30 sectors of data to the host (S280). The prefetch mode is thereby completed.

If the size of the requested data is not larger than the reference, the controller 210 conducts a normal reading operation from the flash memory 230 (S271). The controller 210 reads 30 sectors of data from the flash memory 230, beginning from the start address '100', and transfers the 30 sectors of data directly to the host (S281). The normal reading mode is thereby completed.

A reading method according to an embodiment of the present invention is advantageous as follows. First, it shortens the read processing time by way of the prefetch mode for a long sequential access. This effect arises from the higher HIT probability of the buffer memory which is faster than other storage devices (e.g., the disk or flash memory) in terms of access time. Second, for a short random access, it reduces malfunctions due to data prefetch. This is because the normal reading mode is carried out without the prefetch mode from the flash memory for a short random access. Third, it reduces the time for allocating the buffer memory since there is no allocation of the buffer memory in the short random access. Fourth, the HIT probability of the buffer memory increases because the buffer memory is not use for a short random access. This arises from the fact that there is no need to remove a large amount of data from the buffer memory in order to manage data that has a low probability of reuse.

Herein below is described how the present read processing time according to the method shown in FIG. 4 is shorter than a conventional read processing time. $T_A$ is a time for searching the buffer memory. $T_B$ is a time for searching the flash memory. $T_C$ is a time for allocating the buffer memory for temporary data storage. $T_D$ is a time for conducting the prefetch operation from the disk. $T_E$ is a time for conducting the normal reading operation from the flash memory. $T_F$ is a time for transferring data to the host from the buffer memory. $T_G$ is a time for conducting the prefetch operation from the flash memory. $T_H$ is a time for transferring data, which is read from the flash memory by the normal reading mode, to the host.

$T_E$ is defined as follows:

$$T_E = T_X + T_Y * s. \quad \text{[Equation 1]}$$

In Equation 1, $T_X$ is a standby time until data is initially transferred to the host since data transmission from the flash memory. $T_Y$ is a transmission time proportional to the size of data. The parameter s denotes the size of the requested data.

Meanwhile, $T_F$ is given by $$T_F = T_Z * s. \quad \text{[Equation 2]}$$

From Equation 2, $T_Z$ is a time for transferring data to the host from the buffer memory, proportional to the size of data. The parameter s denotes the size of the requested data.

Now, it is assumed that the time $T_H$ for transferring data directly to the host is the same as the time $T_F$ for transferring data to the host from the buffer memory. For convenience of description, this will be described without considering the disk. In other words, if there is no HIT from the buffer memory, the flash memory must be conditioned in the HIT state.

Then, in the reading method according to an embodiment of the present invention, the read processing time $T_{READ}$ may be satisfied as follows.

$$T_{READ} = T_A + \alpha * T_Z s + (1-\alpha) * (T_B + \gamma * (T_C + T_X + T_Y * S + T_Z * s) \\ * + (1-\gamma) * (T_X + T_Y * s + T_Z * s)) \quad \text{[Equation 3]}$$

In Equation 3, the parameter α is the HIT probability of the buffer memory. The parameter γ is the probability that the requested data are continuous and over the reference in size. The parameter S denotes the size of data to be prefetched. For instance, assuming that the prefetch mode reads twice the requested data, S becomes 2s (i.e., S=2s).

The read processing time $T_{READ}$ will be evaluated as follows for random-access data patterns with smaller sizes and sequential-access data patterns with larger sizes. For convenience of description, the parameters are assumed as shown in Table 1.

TABLE 1

| Parameter | $T_A$ | $T_B$ | $T_C$ | $T_X$ | $T_Y$ | $T_Z$ |
|---|---|---|---|---|---|---|
| Value [μs] | 200 | 200 | 200 | 30 | 20 | 10 |

Here, the conditioning parameters and the read processing times result in as summarized by Table 2.

TABLE 2

| Algorithm | Data pattern | α | γ | s | S | $T_{READ}$ |
|---|---|---|---|---|---|---|
| Prior normal read | Short random access | 0.1 | — | 4 | — | 699 |
| | Long sequential access | 0.1 | — | 64 | — | 2379 |
| Prior prefetch read | Short random access | 0.1 | — | 4 | 128 | 2931 |
| | Long sequential access | 0.6 | — | 64 | 128 | 2036 |
| Present Read | Short random access | 0.11 | 0.01 | 4 | 128 | 539 |
| | Long sequential access | 0.6 | 1.0 | 64 | 128 | 2036 |

As seen from Table 2, according to the reading method of an embodiment of the present invention, for the long sequential access, the present read processing time (2036) is the same as that of the conventional prefetch mode. For the short random access, the present read processing time (539) is much shorter than that of the conventional normal reading mode (699). Thus, the reading method of an embodiment of the present invention is advantageous to enhancing the read processing rate even in the short random-access data pattern, as well as in the long sequential-access data pattern.

In the reading method shown in FIG. 4, the controller 210 first searches the buffer memory 220 in order to find which memory is assigned to the start address input from the host, or searches the flash memory 230 if the start address is not allocated to the buffer memory 220. However, the searching scheme by the controller 210 is not restricted to the aforementioned. For example, the controller 210 may be able to search the buffer memory 220, the flash memory 230, and the disk 240 at the same time in order to find which storage device is assigned to the start address input from the host.

Figure 5:
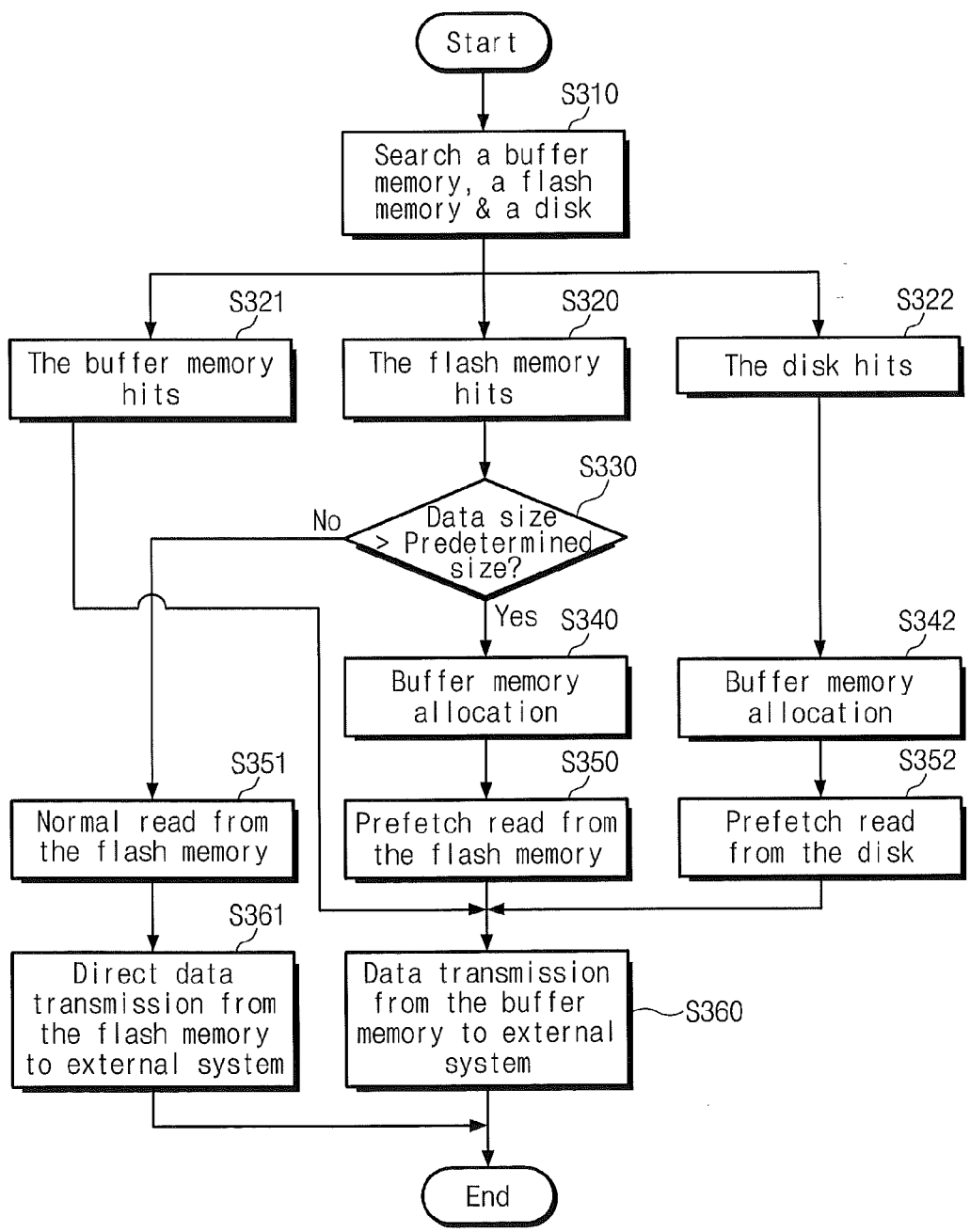
FIG. 5 is a flow chart showing a reading method for searching a buffer memory, a nonvolatile memory, and a disk at the same time according to an embodiment of the present invention.

FIG. 5 is a flow chart showing a reading method for searching the buffer memory 220, the flash memory 230, and the disk 240 at the same time.

The external host (not shown) requests a reading operation from the memory system 20. In detail, the memory system receives read request information, which includes a start address and the number of requested addresses, from the host. For convenience of description, hereinafter it is assumed that the read request is generated in the form of R<100, 30>. And, the prefetch mode is assumed to read two times the amount of data requested by the host.

The memory system 20 accepts the read request R<100, 30> from the external host. The controller 210 simultaneously searches the buffer memory 220, the flash memory 230, and the disk 240, in order to find which storage device is assigned to the start address '100' transferred to the memory system 210 by the read request. Namely, the controller 210 searches to determine whether the start address '100' and addresses corresponding to the 30 sectors of data beginning from the start address '100' are in the buffer memory 220, the flash memory 230, or the disk 240.

If the buffer memory 220 is detected as being conditioned in the HIT state (S321), the controller 210 reads the 30 sectors of data corresponding to the start address '100' from the buffer memory 220 and the transfers the 30 sectors of read data to the host (S360). The read operation (i.e., the normal reading mode) is thereby completed.

If the disk 240 is detected as being conditioned in the HIT state (S322), the controller 210 determines that the start address '100' is allocated to the disk 240. Then, the controller 210 assigns the buffer memory 210 to store data requested from the disk 240 (S342). Thereafter, the controller 210 conducts a prefetch reading operation from the disk 240 (S352). In the prefetch mode, the controller 210 reads data from 60 sectors, beginning from the start address '100', from the disk 240. The 60 sectors of data are stored in the buffer memory 220. After storing the 60 sectors of data into the buffer memory 220, the address mapping table of the buffer memory 220 is updated to include mapping information about the start address '100' and the addresses corresponding to the 60 sectors of data. Thereafter, the controller 210 reads the 30 sectors of data, corresponding to the start address '100', from the buffer memory 220 and transfers the 30 sectors of data to the host (S360). The read operation (i.e., the prefetch mode) is thereby completed.

If the flash memory 230 is conditioned in the HIT state, the controller 210 determines whether the size of the requested data is larger than the reference (S330). If the requested data size is larger than the reference, the controller 210 assigns the buffer memory 210 to temporarily store data requested from the flash memory 230 (S340). Thereafter, the controller 210 conducts the prefetch reading operation from the flash memory 230 (S350). In the prefetch mode, the controller 210 reads the 60 sectors of data, beginning from the start address '100', from the flash memory 230. The 60 sectors of data are stored in the buffer memory 220. After storing the 60 sectors of data into the buffer memory 220, the address mapping table of the buffer memory 220 is updated to include mapping information about the start address '100' and the addresses corresponding to the 60 sectors of data. Thereafter, the controller 210 reads the 30 sectors of data, corresponding to the start address '100', from the buffer memory 220 and transfers the 30 sectors of read data to the host (S360). The read operation (i.e., the prefetch mode) is thereby completed.

If the requested data size is not larger than the reference, the controller 210 conducts the normal reading operation from the flash memory 230 (S351). The controller 210 reads the 30 sectors of data, corresponding to the start address '100', from the flash memory 230 and transfers the 30 sectors of read data to the host (S360). The read operation (i.e., the normal reading mode) is thereby completed.

Figure 6:
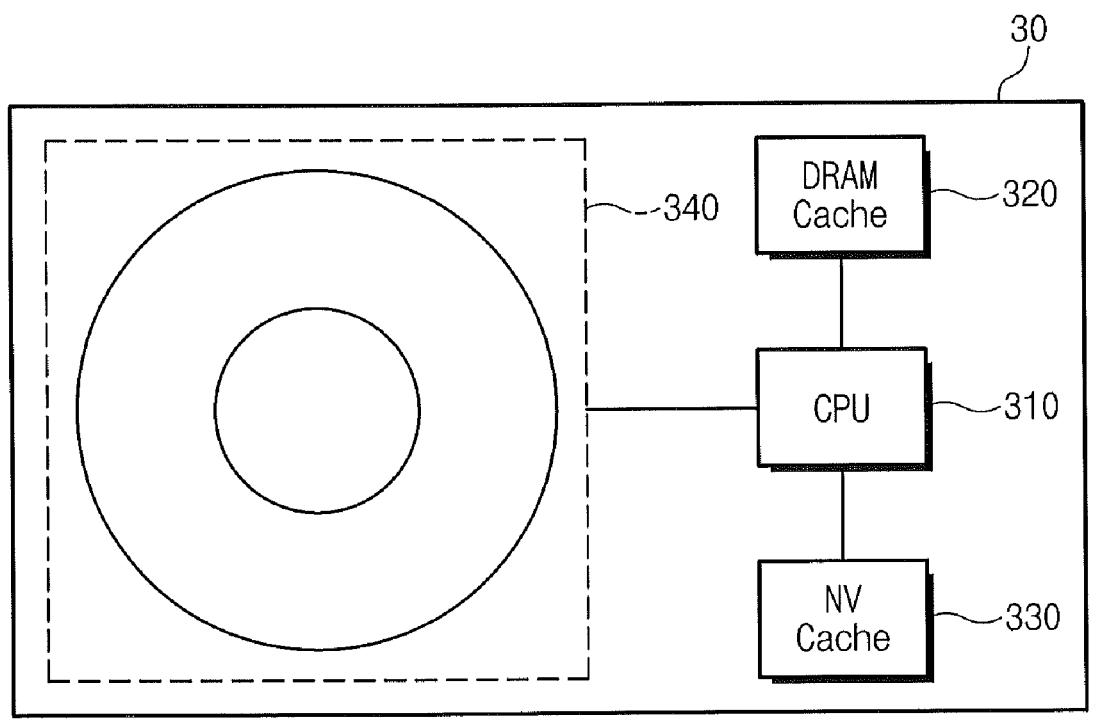
FIG. 6 shows a structure of a hybrid hard disk drive according to an embodiment of the present invention.

The memory system 20 of an embodiment of the present invention is also applicable to a hybrid HDD. A hybrid HDD is regarded as a next-generation storage device where a nonvolatile cache memory is combined with a general HDD. FIG. 6 shows the structure of a hybrid hard disk drive according to an embodiment of the present invention. Referring to FIG. 6, the hybrid HDD includes a controller 310 having an embedded CPU therein, a DRAM cache memory 320, a nonvolatile cache memory 330, and an HDD 340. The controller 320, the nonvolatile cache memory 330, and the HDD 340 shown in FIG. 6 are the same as the controller 210, the buffer memory 220, the flash memory 230, and the disk 240 shown in FIG. 3, respectively.

The nonvolatile cache memory 330 is operable to save power (up to 90 percent), and has boot and data processing rates that are two or three times faster then a general HDD because it is able to promptly read and write data. In addition, the hybrid HDD improves endurance by minimizing mechanical operations and reducing power consumption. The flash memory used in the hybrid HDD may be, for example, a NAND-type flash memory.

During a reading operation to the nonvolatile cache memory 330, it is determined whether to conduct the prefetch or normal reading mode in accordance with the size of requested data. For instance, if a requested data size is larger than a reference, the hybrid HDD 30 conducts the prefetch operation from the nonvolatile cache memory 330.

A memory system and data reading method according to an embodiment of the present invention determines whether to execute a prefetch or normal reading operation from the nonvolatile memory in accordance with the requested data size. If the requested data size is larger than a reference, a prefetch reading operation is conducted from the nonvolatile memory. Thereby, the memory system according to an embodiment of the present invention is may increase the probability of utilizing the buffer memory during a reading operation, and also of enhancing a data reading rate.

As described above, a memory system and data reading method according to an embodiment of the present invention may operate by determining whether to conduct a prefetch reading operation in accordance with the size of data requested for reading. Therefore, a data rate of reading may be enhanced because of differentiated reading operations in accordance with data patterns.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for reading data in a memory system including a buffer memory, a flash memory, and a disk, comprising: simultaneously determining whether an input address in a read request is allocated to the buffer memory, the flash memory, or the disk; determining whether a size of requested data is larger than a reference if the input address is allocated to the flash memory; and conducting a reading operation from the flash memory if the requested data size is larger than the reference, wherein a controller conducts the reading operation from the disk in response to the read request, wherein during a normal reading operation from the flash memory, data read from the flash memory is transferred directly to an external system without passing through the buffer memory.

2. A memory system comprising:

a flash memory; a disk; a buffer memory to temporarily store data read from the flash memory or the disk during a prefetch reading operation; and a controller operable to control the flash memory, the disk, and the buffer memory and to determine whether to conduct the prefetch reading operation or a normal reading operation from the flash memory in accordance with a size of data requested by a read request, wherein the normal reading operation is conducted from the flash memory if the requested data size is larger than a reference, wherein the controller conducts the reading operation from the disk in response to the read request, wherein during the normal reading operation from the flash memory, data read from the flash memory is transferred directly to an external system without passing through the buffer memory.

3. The memory system as set forth in claim 2, wherein the controller simultaneously determines whether an address input by the read request is allocated to the buffer memory, the flash memory, or the disk.

4. The memory system as set forth in claim 2, wherein the controller first determines whether an address input by the read request is allocated to the buffer memory.

5. The memory system as set forth in claim 4, wherein the controller transfers the requested data to an external system from the buffer memory if the input address is allocated to the buffer memory.

6. The memory system as set forth in claim 4, wherein the controller determines whether the input address is allocated to the flash memory unless the input address is allocated to the buffer memory.

7. The memory system as set forth in claim 6, wherein the controller determines whether to conduct the prefetch reading operation or the normal reading operation in accordance with the requested data size if the input address is allocated to the flash memory.

8. The memory system as set forth in claim 6, wherein the controller conducts the prefetch reading operation from the disk unless the input address is allocated to the flash memory.

* * * * *